United States Patent [19]
Kiyosumi et al.

[11] Patent Number: 4,603,059
[45] Date of Patent: Jul. 29, 1986

[54] METHOD OF MANUFACTURING MIS CAPACITORS FOR SEMICONDUCTOR IC DEVICES

[75] Inventors: Fumio Kiyosumi; Masayoshi Ino, both of Tokyo, Japan

[73] Assignee: OKI Electric Industry Co., Ltd., Tokyo, Japan

[21] Appl. No.: 691,671

[22] Filed: Jan. 15, 1985

[30] Foreign Application Priority Data

Jan. 23, 1984 [JP] Japan .................... 59-8413

[51] Int. Cl.$^4$ .......................................... H01L 21/285
[52] U.S. Cl. ......................................... 427/81; 427/93; 427/94; 427/95; 427/377
[58] Field of Search ................ 427/79, 81, 93, 94, 427/95, 377

[56] References Cited

U.S. PATENT DOCUMENTS 4,200,474  4/1980  Morris .................................. 427/79
4,250,206  2/1981  Bate et al. ........................... 427/94
4,438,157  3/1984  Romano-Moran ................. 427/94

Primary Examiner—Richard Bueker
Attorney, Agent, or Firm—Frishauf, Holtz, Goodman & Woodward

[57] ABSTRACT

A method of manufacturing MIS capacitors for semiconductor IC devices, which have a three-ply dielectric layer formed of a first oxide film, a nitride film, and a second oxide film, thereby having high dielectric constants, stable electric characteristics, and high dielectric strength. First, the first oxide film is formed on a semiconductor substrate, on which film is then formed the nitride film, followed by thermal treatment of the nitride film in an oxiding atmosphere to form the thin second oxide film on the nitride film, to obtain the three-ply dielectric layer. The dielectric layer is further thermally treated in an inert gas atmosphere to eliminate a boundary level, etc. developed between the nitride film and the second oxide film at the time of formation of the second oxide film, for electrical stability of the dielectric layer.

8 Claims, 10 Drawing Figures

METHOD OF MANUFACTURING MIS CAPACITORS FOR SEMICONDUCTOR IC DEVICES

BACKGROUND OF THE INVENTION

This invention relates to the manufacture of MIS capacitors for semiconductor IC devices, and more particularly to a method of manufacturing MIS capacitors adapted for use in dynamic MOS memory IC devices.

In conventional dynamic random access memories (DRAM) of one transistor/one capacitor type, silicon dioxide ($SiO_2$) is mostly used as the dielectric material of the memory cell capacitor. With recent increasing demand for higher packing density of DRAM IC's, the component elements have been becoming smaller in size. A MIS (Metal Insulator Semiconductor) capacitor for the memory cell should have a capacitance value above a certain level despite its reduced size, so as to prevent soft error due to alpha rays and to insure stable operation of the memory circuit.

Two measures are known as effective to increase the capacitance of such a small-area MIS capacitor. One is to reduce the thickness of the dielectric layer, and the other is to use a dielectric material with a high dielectric constant as the capacitor dielectric material. However, reduction of the dielectric layer thickness can result in increased pin holes in the layer, leading to degraded dielectric strength and consequently low yield of the memory IC. On the other hand, silicon nitride ($Si_3N_4$) or tantalum oxide ($Ta_2O_3$) is conventionally used as the high dielectric-constant dielectric material. However, the use of these materials in the form of a single dielectric layer can cause electrical unstableness of the memory IC device, increased leakage current, and reduced dielectric strength due to increased pin holes, etc.

SUMMARY OF THE INVENTION

It is the object of the invention to provide a method of manufacturing MIS capacitors for use in semiconductor IC devices, which have high dielectric constants, stable electric characteristics, and high dielectric strength.

The present invention provides a method of manufacturing a MIS capacitor for use in a semiconductor IC device, which comprises (1) forming a first oxide film on a semiconductor substrate, (2) forming a nitride film on the first oxide film, (3) thermally treating the nitride film in an oxidizing atmosphere to form a thin second oxide film on the nitride film, whereby the semiconductor substrate has a laminated dielectric layer of the first oxide film, the nitride film, and the second oxide film formed thereon, and (4) thermally treating the semiconductor substrate having the laminated dielectric layer in an inert gas atmosphere.

Preferably, the above step (1) comprises thermally treating the silicon semiconductor substrate in an oxidizing atmosphere to form a first silicon oxide film thereon. Also preferably, the step (2) comprises forming a silicon nitride film on the first silicon oxide film by means of chemical vapor deposition using a mixture gas of dichlorosilane and ammonia. Further preferably, the step (3) comprises thermally treating the silicon nitride film in an oxidizing atmosphere to form a thin second silicon oxide film on the silicon nitride film.

The above and other objects, features and advantages of the invention will be more apparent from the ensuing detailed description taken in conjunction with the accompanying drawings.

DETAILED DESCRIPTION

Figure 1A:
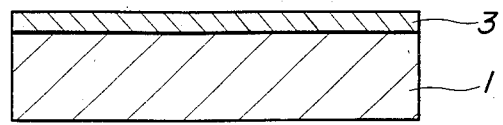
FIG. 1 (a)–FIG. 1 (e) are sectional views of a semiconductor body in different steps according to the method of the invention.
Figure 1B:
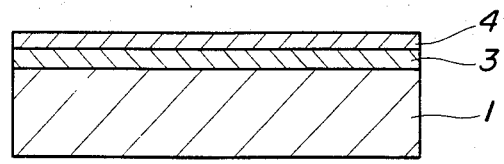
Figure 1C:
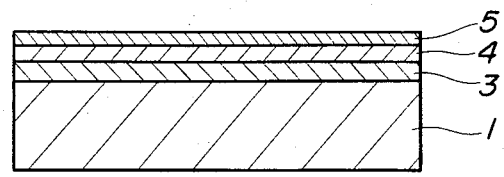

The invention will now be described in detail with reference to the drawings.

Referring to FIG. 1 (a)–FIG. 1 (e), there is shown the method of manufacturing a MIS capacitor according to the invention. In the step of FIG. 1 (a), a first oxide film 3 preferably formed of silicon dioxide ($SiO_2$) is formed on the major surface of a semiconductor substrate 1 formed e.g. of single crystal silicon, by thermally oxidizing the major surface of the substrate in an oxidizing atmosphere. The first silicon dioxide film should preferably have a thickness of from 50 to 500 Angstroms. The oxidizing atmosphere may be either a dry oxygen atmosphere or a wet oxygen atmosphere. For example, in a dry oxygen atmosphere, a silicon dioxide film 3 with a thickness of from 300 to 500 Angstroms will be formed after thermal treatment for 20 to 50 minutes at a temperature of 1,000° C. In a wet oxygen atmosphere, a silicon dioxide film 3 with a thickness of from 50 to 300 Angstroms will be formed after thermal treatment for 5 to 50 minutes at a temperature of 800° C.

Then in the step of FIG. 1 (b), a nitride film 4 preferably formed of silicon nitride ($Si_3N_4$) is formed on the first silicon dioxide film 3. The silicon nitride film 3 should preferably have a thickness of from 50 to 500 Angstroms. Preferably, the formation of the silicon nitride film should be effected by means of chemical vapor deposition using a mixture gas of dichlorosilane ($SiH_2Cl_2$) and ammonia ($NH_3$) at a temperature of from 700° to 800° C. and for a treatment time of from 5 to 50 minutes.

Next, as shown in FIG. 1 (c), the surface of the silicon nitride film 4 is subjected to thermal treatment under an oxidizing atmosphere to form another thin silicon dioxide ($SiO_2$) film, as a second oxide film 5, preferably with a thickness of from 20 to 50 Angstroms. The oxidizing atmosphere may be either a dry oxygen atmosphere or a wet oxygen atmosphere. For example, in a dry oxygen atmosphere, a second silicon oxide film 5 with a thickness of from 20 to 40 Angstroms will be formed after thermal treatment for 30 to 100 minutes at a temperature of 900° C. In a wet oxygen atmosphere, a second silicon dioxide film 5 with a thickness of from 25 to 50 Angstroms will be formed after 20 to 60 minute thermal treatment at a temperature of 950° C. It is deduced that the formation of the second silicon dioxide (SiO$_2$) film 5 on the silicon nitride (Si$_3$N$_4$) film 4 through thermal treatment is due to the following chemical reactions:

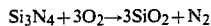

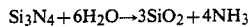

The growth rate of the silicon dioxide film 5 by the above reactions is much smaller than that of the silicon dioxide film 3 due to large oxidation resistivity of the silicon nitride (Si$_3$N$_4$), thereby allowing the silicon dioxide film 5 to have a very small thickness. That is, direct formation of an electrode on the silicon nitride film 4 can lead to increased leakage current, and further the thickness of the whole dielectric layer should desirably be as small as possible to match with the reduced sizes of the component elements of the MIS type semiconductor device. Therefore, the thickness of the second silicon dioxide film 5 should be as small as possible insofar as it can eliminate the above-mentioned defect of the silicon nitride film 4. By the above described steps of FIG. 1 (a)–FIG. 1 (c) a dielectric layer of a MIS capacitor is formed which has a three-ply structure formed of the first silicon dioxide film 3, the silicon nitride film 4, and the second silicon dioxide film 5.

Then in the step of FIG. 1 (d), the substrate 1 with the first and second silicon dioxide films 3, 5 and the silicon nitride film 4 formed thereon is subjected to thermal treatment in an inert gas atmosphere at a temperature of from 900° to 1100° C. and for a treatment time of from 10 to 120 minutes. The inert gas may be nitrogen gas (N$_2$), argon (Ar), or hydrogen (H$_2$). This thermal treatment is important in the method of the invention because it effectively reduces a boundary level and/or a trap developed between the silicon nitride film 4 and the second silicon dioxide film 5 when the latter was formed over the former by thermal oxidation, and which causes uncertain electrical characteristics of the semiconductor device, namely variation in capacitance-voltage characteristics of the MIS capacitor.

Figure 1D:
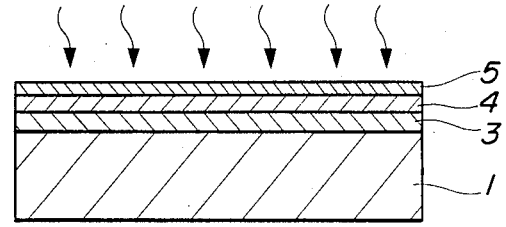
Figure 1E:
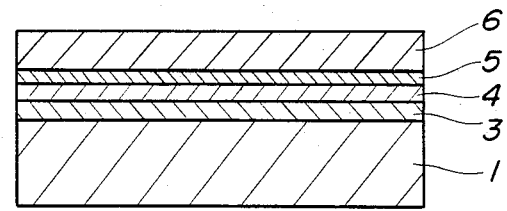

In the step of FIG. 1 (e) following the thermal treatment of FIG. 1 (d), a conductor material 6 is formed as a MIS capacitor plate over the dielectric layer of a three-ply structure obtained by the FIG. 1(d) step. The conductor material may be selected from conductive poly-crystal silicon containing impurities such as phosphorus (P), arsenic (As), and boron (B), high melting point metals such as molybdenum (Mo), tungsten (W), and titanium (Ti), silicides thereof, and aluminum (Al).

As stated above, a MIS capacitor manufactured by the method of the invention comprises a dielectric layer of a three-ply structure wherein a nitride film with a high dielectric constant is interposed between first and second silicon dioxide films, and accordingly possesses a high total equivalent dielectric constant. Therefore, if the dielectric layer according to the invention is used as a MIS capacitor in a DRAM memory cell of one transistor/one capacitor type as hereinafter described, the capacitor has increased capacitance per unit area, thereby permitting reduction of the device size.

Further, with the three-ply structure, the dielectric layer is free of pin holes which would conventionally be present in a single-film dielectric layer, thereby having a remarkably improved dielectric strength characteristic.

Moreover, by forming a thin second silicon dioxide film over the nitride film which generally has a larger band gap than a silicon dioxide film and accordingly can suffer from large leakage current, the leakage current can be greatly reduced.

Figure 2:
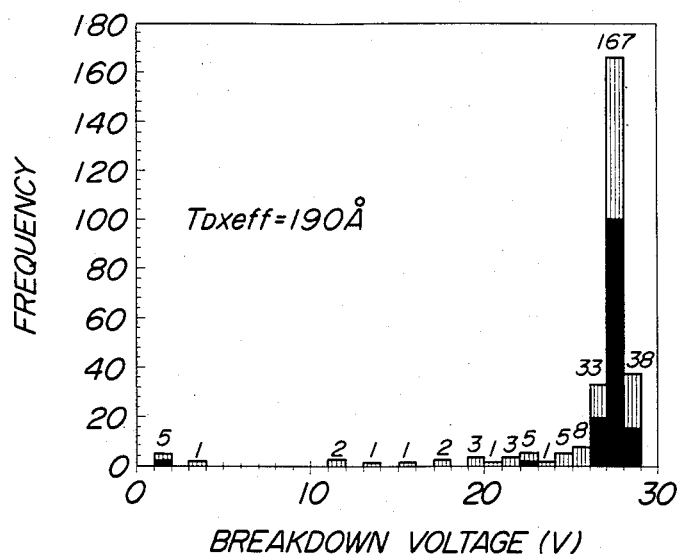
FIG. 2 is a histogram showing, by way of example, the dielectric strength characteristics of MIS capacitors manufactured by the method of the invention.
Figure 3:
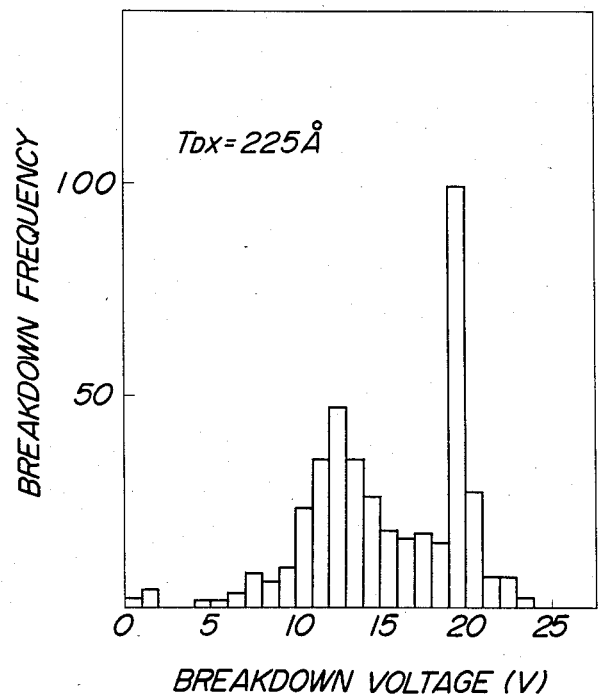
FIG. 3 is a histogram showing, by way of example, the dielectric strength characteristics of conventional MIS capacitors of which the dielectric material is formed of a single silicon oxide film.

An example of the method according to the invention will now be described with reference to FIG. 2–FIG. 4.

EXAMPLE

A substrate 1 formed of single crystal silicon was subjected to oxidizing treatment in a dry oxygen atmosphere at 900° C. and for 18 minutes to form a first silicon oxide film 3 having a thickness of approximately 110 Angstroms over the major surface of the substrate 1. The substrate 1 had its first silicon dioxide film 3 subjected to chemical vapor deposition using a mixture gas of dichlorosilane (SiH$_2$Cl$_2$) and ammonia (NH$_3$) at 800° C. and for 10 minutes to form a silicon nitride film 4 having a thickness of approximately 100 Angstroms over the first silicon dioxide film 3. Then, the silicon nitride film 4 was subjected to thermal oxidization in a wet oxidizing atmosphere at 950° C. and for 40 minutes to form a second silicon dioxide film 5 having a thickness of approximately 40 Angstroms over the silicon nitride film 4. Thermal treatment of the substrate 1 thus formed with the three films was effected in an inert gas atmosphere composed of nitrogen gas (N$_2$) for 30 minutes to eliminate a boundary level, etc. between the silicon nitride film 4 and the second silicon dioxide film 5. In this manner, a three-ply dielectric film with a total thickness of approximately 225 Angstroms was formed over the single crystal silicon substrate 1, which is composed of the first silicon dioxide film 1, the silicon nitride film 4, and the second silicon dioxide film 5.

MIS capacitors formed of three-ply dielectric films thus prepared by the same steps as above were subjected to a dielectric breakdown voltage test. FIG. 2 shows the dielectric strength characteristics of the MIS capacitors having three-ply dielectric layers according to the invention as results of the test, while FIG. 3 shows the dielectric strength characteristic of MIS capacitors formed of conventional single silicon dioxide layers having a thickness of 225 Angstroms for comparison. While the greatest number group of the three-ply dielectric layers according to the present invention show a breakdown voltage of approximately 28 volts, that of the conventional single silicon oxide films show only approximately 20 volts. Furthermore, even three-ply dielectric films of lower breakdown voltage groups of the present invention are smaller in number than conventional dielecric films of the respective same voltage groups. Thus the three-ply dielectric films manufactured by the method of the present invention possess highly superior dielectric strength to when compared with the conventional single-film dielectric films.

Figure 4:
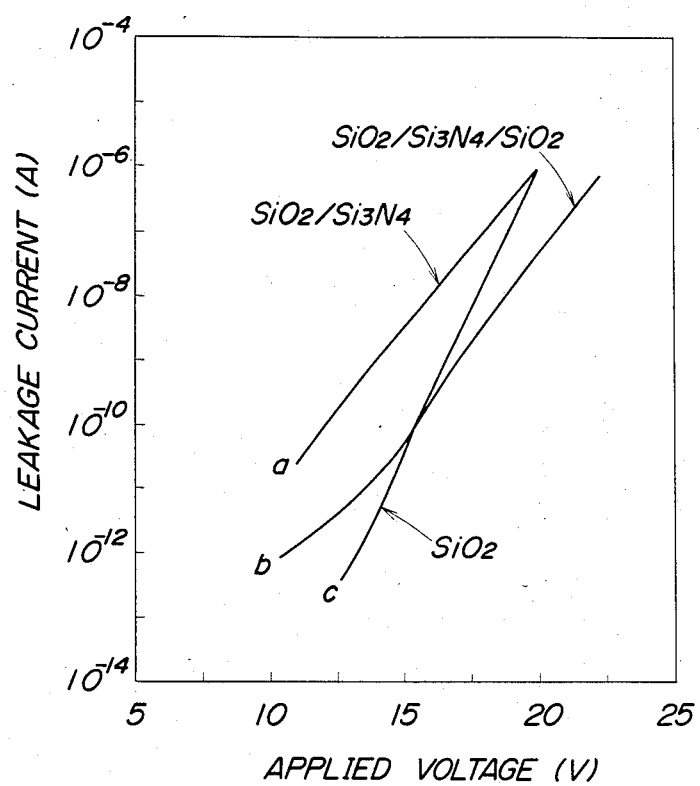
FIG. 4 is a graph showing, by way of example, curves indicative of the leakage current vs. applied voltage characteristics of a MIS capacitor manufactured by the method of the present invention, and conventional MIS capacitors having a composite $SiO_2/Si_3N_4$ dielectric layer and a single $SiO_2$ dielectric layer, respectively.

FIG. 4 shows the leakage current vs. applied voltage characteristic of a MIS capacitor manufactured by the method of the present invention in comparison with conventional MIS capacitors. In the graph, the curve b represents the characteristic of the MIS capacitor according to the invention, a that of a conventional two-ply dielectric layer formed of a silicon dioxide film and a silicon nitride film, and c that of a conventional single silicon oxide layer, respectively. It is to be noted that the MIS capacitor having a three-ply dielectric layer according to the present invention is superior in leakage current characteristic to the conventional MIS capacitors.

The following table shows the dielectric constant values of a three-ply dielectric film manufactured by the method of the present invention and a conventional dielectric film formed of a single silicon oxide film, and the capacitance values of capacitors formed by the dielectric films.

|  | Thickness (Å) | Dielectric Constant | Capacitor Capacitance (fF/m$^2$) |
|---|---|---|---|
| SiO$_2$/Si$_3$N$_4$/ SiO$_2$ of Present Invention | 225 | 4.6 | 1.82 |
| SiO$_2$ of Prior Art | 225 | 3.9 | 1.53 |

The table establishes that the dielectric layer according to the present invention provides a capacitance value about 1.2 times as large as the value of the conventional dielectric layer. Therefore, to have the same capacitance value as that of the three-ply dielectric layer capacitor according to the present invention, the conventional single-layer capacitor must have its film thickness reduced to 1/1.2 times as large as that of the former. Thus, in forming a MIS capacitor, the three-ply dielectric layer of the present invention with a thickness of 225 Angstroms is substantially equivalent to the conventional single silicon dioxide film with a thickness of 190 Angstroms.

Figure 5:
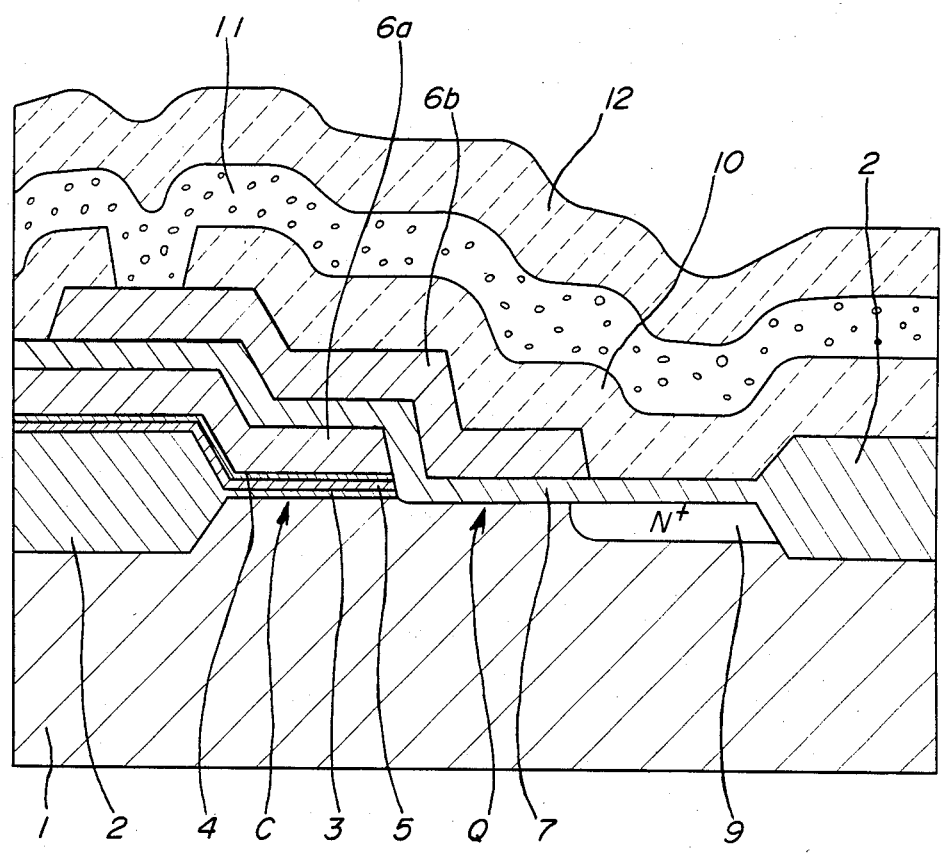
FIG. 5 is a sectional view of a DRAM semiconductor device of one transistor/one capacitor type using a MIS capacitor according to the method of the present invention.
Figure 6:
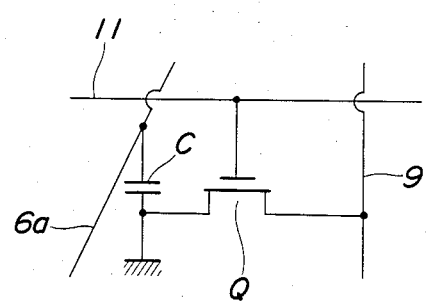
FIG. 6 is a circuit diagram of the equivalent circuit of the semiconductor device of FIG. 5.

FIG. 5 and FIG. 7 show a memory cell in a DRAM semiconductor device of one transistor/one capacitor type having a double-layer poly-crystal structure, which employs a MIS capacitor having a three-ply dielectric layer manufactured by the method of the present invention. In FIG. 5, a section of the semiconductor device is illustrated. A transistor Q and a cell capacitor C are formed within each active region isolated from other active regions by field silicon dioxide films 2. The cell capacitor C is formed by a p-type single crystal silicon substrate 1, a three-ply dielectric layer formed of a silicon dioxide film 3, a silicon nitride film 4, and a silicon dioxide film 5 according to the present invention, and a conductive polycrystal silicon film 6a. The transistor Q is formed by the single crystal silicon substrate 1, a gate-insulating film 7 formed of a silicon oxide film, a gate electrode 6b formed of conductive poly-crystal silicon, and an N+ diffused layer 9. The gate electrode 6b is electrically connected to an aluminum wiring layer 11 for external connection. The N+ diffused layer 9 is also electrically connected to another aluminum wiring layer, not shown, at a suitable location for external connection. The DRAM of FIG. 5 can be expressed by an equivalent circuit shown in FIG. 6, wherein the N+ diffused layer 9 is intended as the bit line, and the aluminum wiring layer 11 as the word line. Since in the illustrated DRAM of one transistor/one capacitor type the gate-insulating film of the cell capacitor C is formed by a three-ply dielectric layer manufactured by the method of the invention, the cell capacitor can have a larger capacitance value per unit area, thereby reducing the possibility of occurrence of soft error due to alpha ray for operational stability of the device.

What is claimed is:

1. A method of manufacturing a MIS capacitor for use in a dynamic MOS memory IC device, comprising the steps of:
    (1) forming a thermally-grown silicon oxide on a silicon substrate;
    (2) forming a silicon nitride film on said silicon oxide film by chemical vapor deposition;
    (3) forming a thin silicon oxide film on said silicon nitride film by heating said silicon nitride film in an oxidizing atmosphere, to provide on to said silicon substrate a laminated dielectric layer comprising sequentially said silicon oxide film, said silicon nitride film and said thin silicon oxide film;
    (4) thermally treating said silicon substrate having said laminated dielectric layer in an inert gas atmosphere at a high temperature; and
    (5) forming a conductive film as a capacitor plate on the surface of said laminated dielectric layer.

2. The method of claim 1, wherein said first silicon oxide film is 50 to 500 Å thick, and said step (1) is carried out in a dry oxygen atmosphere at about 1000° C. for 20 to 50 minutes, or in a wet oxygen atmosphere at about 800° C. for 5 to 50 minutes.

3. The method of claim 1, wherein said silicon nitride film is 50 to 500 Å thick, and said step (2) is carried out by deposition from a gaseous mixture of dichlorosilane and ammonia at a temperature of 700° to 800° C. for 5 to 50 minutes.

4. The method of claim 1, wherein said thin silicon oxide film is 20 to 50 Å thick, and said step (3) is carried out in a dry oxygen atmosphere at 900° C. for 30 to 100 minutes, or in a wet oxygen atmosphere at 950° C. for 20 to 60 minutes.

5. The method of claim 1, wherein said step (4) is carried out in an inert gas selected from the group consisting of N$_2$, Ar, and H$_2$ at 900° to 1000° C. for 10 to 120 minutes.

6. The method of claim 1, wherein said first silicon oxide film is 50 to 500 < thick, said silicon nitride film is 50 to 500 Å thick and said thin silicon oxide film is 20 to 50 Å thick.

7. The method of claim 6, wherein said step (4) is carried out in an inert gas selected from the group consisting of N$_2$, Ar, and H$_2$ at 900° to 1000° C. for 10 to 120 minutes.

8. The method of claim 7, wherein said step (1) is carried out in a dry oxygen atmosphere at about 1000° C. for 20 to 50 minutes, or in a wet oxygen atmosphere at about 800° C. for 5 to 50 minutes; said step (2) is carried out by deposition from a gaseous mixture of dichlorosilane and ammonia at a temperature of 700° to 800° C. for 5 to 50 minutes and said step (3) is carried out in a dry oxygen atmosphere at 900° C. for 30 to 100 minutes, or in a wet oxygen atmosphere at 950° C. for 20 to 60 minutes.

* * * * *